United States Patent
Chung et al.

(10) Patent No.: US 7,884,889 B2
(45) Date of Patent: Feb. 8, 2011

(54) FRINGE FIELD SWITCHING TYPE LIQUID CRYSTAL DISPLAY ARRAY SUBSTRATE AND METHOD OF MANUFACTURING THE SAME

(75) Inventors: Te-Chen Chung, Kun Shan (CN);
Tean-Sen Jen, Kun Shan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 104 days.

(21) Appl. No.: 12/050,777

(22) Filed: Mar. 18, 2008

(65) Prior Publication Data
US 2009/0009672 A1     Jan. 8, 2009

(30) Foreign Application Priority Data
Jul. 6, 2007    (CN) .................. 2007 1 0126082

(51) Int. Cl.
*G02F 1/1343* (2006.01)
*G02F 1/1333* (2006.01)
(52) U.S. Cl. .......................... 349/38; 349/54
(58) Field of Classification Search ............ 349/54, 349/38, 39, 141, 55
See application file for complete search history.

(56) References Cited

U.S. PATENT DOCUMENTS

| 6,562,645 | B2 | 5/2003 | Sung et al. | |
|---|---|---|---|---|
| 6,580,487 | B1 | 6/2003 | Kim et al. | |
| 6,646,706 | B2 | 11/2003 | Lim et al. | |
| 6,721,028 | B2 | 4/2004 | Kim et al. | |
| 2002/0180920 | A1* | 12/2002 | Noh et al. | 349/141 |
| 2005/0286003 | A1* | 12/2005 | Lee et al. | 349/141 |

FOREIGN PATENT DOCUMENTS

| CN | 1873509 A | 12/2006 |
|---|---|---|
| CN | 101075054 A | 11/2007 |
| TW | 594347 B | 6/2004 |

\* cited by examiner

*Primary Examiner*—Mark A Robinson
*Assistant Examiner*—Michael Inadomi
(74) *Attorney, Agent, or Firm*—Perkins Coie LLP (57) ABSTRACT

An array substrate comprises a scanning line; a data line crossing the scanning line; a pixel electrode; a common electrode; and a Thin Film Transistor comprising a gate electrode connected to the scanning line, a source electrode connected to the data line and a drain electrode connected to the pixel electrode, the drain electrode and the scanning line forming a first capacitor therebetween. The array substrate further comprises an auxiliary capacitor which is in parallel with the first capacitor.

13 Claims, 9 Drawing Sheets

FRINGE FIELD SWITCHING TYPE LIQUID CRYSTAL DISPLAY ARRAY SUBSTRATE AND METHOD OF MANUFACTURING THE SAME

TECHNICAL FIELD

The present invention relates to liquid crystal displays, and in particular, to an array substrate of Fringe Field Switching (FFS) type liquid crystal display and a method for manufacturing the array substrate.

BACKGROUND

Liquid crystal displays (LCDs) are advantageous in being light, thin and low in power consumption, and have been widely used in modern information devices such as notebook computers, mobile phones, and personal digital assistants (PDAs). However, a liquid crystal molecule in a general LCD has different refractive indices along a long axis and a short axis thereof. Thus when an LCD is viewed from different directions, images displayed thereon will have a lower contrast as the angle between a sight line of user and a direction orthogonal to the display surface increases, yielding an insufficient view angle in comparison with conventional CRT displays.

Various solutions, for example, In-Plane Switching (IPS) and Fringe Field Switching (FFS), have been proposed to solve the problem of narrow view angle for liquid crystal displays. FFS differs from IPS in that a transparent conductive layer is employed as a common electrode and is entirely placed under a pixel electrode, which gives LCDs using FFS technique a denser distribution of electric field and a larger transmissive area.

Figure 1:
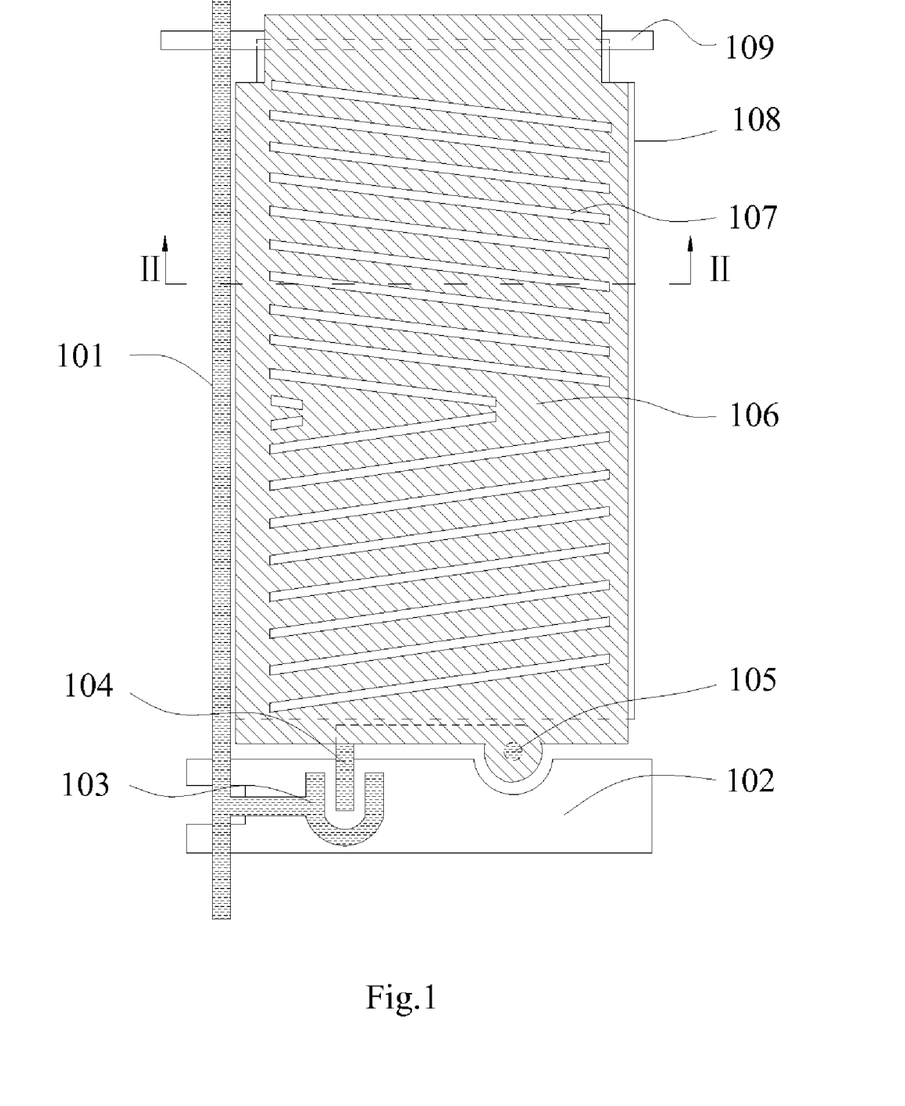
FIG. 1 shows a plan view of a pixel structure in a conventional FFS type LCD.
Figure 2:
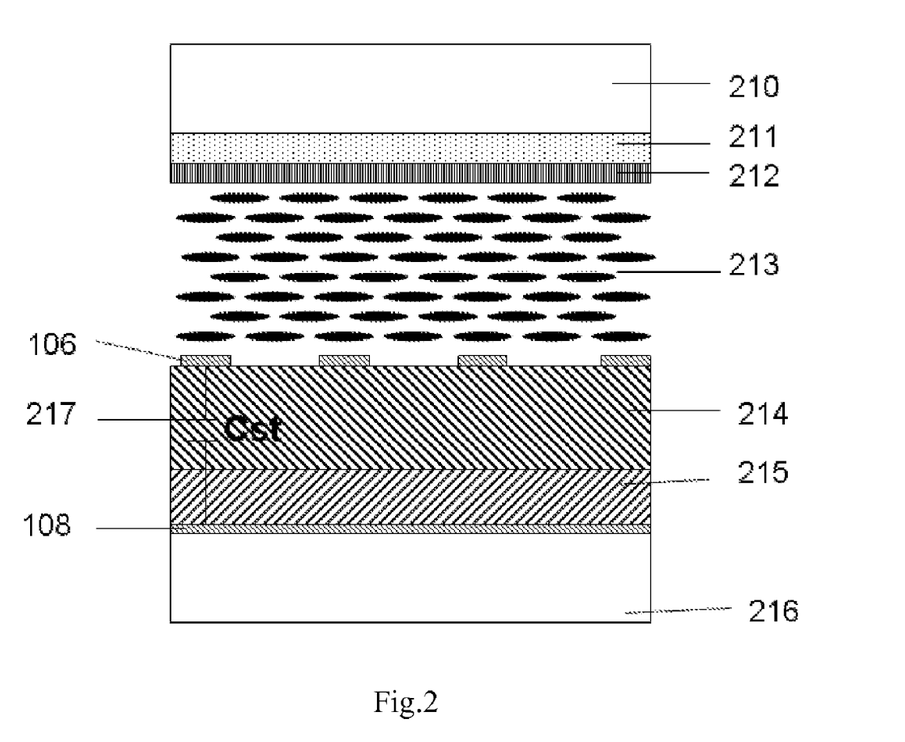
FIG. 2 shows a sectional view of the pixel structure of the conventional FFS type LCD.

FIG. 1 shows a plan view of a pixel structure in a conventional FFS type LCD. For the sake of clarity, FIG. 1 only shows the array substrate portion in the pixel structure, whereas liquid crystal layer and color filters in the LCD, the positions of which are shown in FIG. 2, are omitted. In FIG. 1, reference numbers 101, 102 indicate a data line and a scanning line, respectively, and pixels are formed in the array substrate at crossing areas of a plurality of data lines and a plurality of scanning lines. Each of the pixels has a pixel electrode 106 made of a transparent conductive material and having a plurality of stripe-like slits 107 formed thereon for the transmission of electric field. Operation of each pixel is controlled by a Thin Film Transistor (TFT) having a source electrode connected to the data line 101, a gate electrode connected to the scanning line 102, and a drain electrode 104 connected to the pixel electrode 106 via a through-hole 105. Each pixel also has a common electrode 108 made of a transparent conductive material, which is supplied with voltage via a common electrode bus line 109.

FIG. 2 shows a sectional view taken along a line II-II of the pixel structure of the conventional FFS type LCD in FIG. 1. In FIG. 2, a reference number 210 is used for a glass substrate of a color filter, 211 for a color filter film, 212 for a protection layer, 213 for a liquid crystal layer, 216 for a glass substrate of the array substrate, 215 for a gate electrode insulating layer, and 214 for a passivation layer. Such a pixel structure can be equivalent to a storage capacitor 217 formed between the pixel electrode 106 and the common electrode 108, wherein the pixel electrode 106 and the common electrode 108 serve as the two electrode plates of the storage capacitor 217, and the passivation layer 214 and the gate electrode insulating layer 215 serve as the dielectric between the electrode plates. Alternatively, any material known in the art can be used for the substrates 210 and 216 to replace glass.

In the structure described above, a feed through voltage $\Delta Vp$ of a pixel, which is the difference of the input data voltage that will pass to the pixel electrode via the TFT and the pixel electrode holding voltage, is represented by the following equation (1).

$$\Delta Vp = Cgson/(Cgson + CLc + Cst)*(Vgh - Vgl) \qquad (1)$$

Wherein Cgson represents the capacitance value of a capacitor (referred to as a first capacitor) between the scanning line 102 and the drain electrode 104, CLc represents the value of the liquid crystal capacitance, Cst represents the capacitance value of the storage capacitor 217, Vgh represents a high voltage applied on the scanning line 102, and Vgl represents a low voltage applied on the scanning line 102. According to the equation (1), magnitude of the feed through voltage $\Delta Vp$ is determined by the relation among the respective capacitance values when the high and low voltages on the scanning line 102 is given.

Exposure and etching are often used in manufacturing array substrates for LCDs. During photo processing, etching processing and the like, dimensional deviation may occur in the pixel electrode 106 having the slits 107 due to misalignment in exposed position and unevenness in etching, and such a deviation may even be 1 micrometer or more. Because the pixel electrode 106 serves as an electrode plate of the storage capacitor 217, the capacitance value Cst of the storage capacitor 217 may also vary accordingly, and the feed through voltage $\Delta Vp$ will also vary according to the above equation (1).

Table 1 shows simulation data of variation in feed through voltage $\Delta Vp$ for a 32-inch LCD due to the dimensional deviation in the pixel electrode, wherein the high voltage Vgh and the low voltage Vgl on the scanning line 102 are +23V and −6V respectively. It is noted that in the equation (1), Cgson is much less than CLc and Cst in magnitude, and thus the equation (1) may be rewritten into the following equation (2).

$$\Delta Vp \sim Cgson/(CLc + Cst)*(Vgh - Vgl) \qquad (2)$$

In the equation (2), the magnitude of CLc depends on the status of the liquid crystal and can be disregarded. Therefore, the magnitude of $\Delta Vp$ is substantially reflected by the ratio of Cgson/Cst.

From Table 1 below, it is apparent that in accordance with dimensional deviation occurring in the pixel electrode (that is, non-zero values in the first row of the table), the ratio of Cgson/Cst varies greatly in comparison with the case where there is no such dimensional deviation (the column in which the first row has a zero value). This, in turn, induces substantial variation in the feed through voltage up to more than 25%. Variation in the feed through voltage $\Delta Vp$ will undesirably introduce flicker of pictures and the like, and cause degradation in the quality of displayed pictures.

TABLE 1 variation in feed through voltage for a 32" LCD

| | Dimensional deviation in pixel electrode (μm) | | | | |
|---|---|---|---|---|---|
| | −0.5 | −0.25 | 0 | 0.25 | 0.5 |
| Cgson/Cst | 0.03503 | 0.03112 | 0.02801 | 0.02550 | 0.02343 |
| ΔVp (V) | 1.02 | 0.90 | 0.81 | 0.74 | 0.68 |

TABLE 1-continued variation in feed through voltage for a 32" LCD

| | Dimensional deviation in pixel electrode (μm) | | | | |
|---|---|---|---|---|---|
| | −0.5 | −0.25 | 0 | 0.25 | 0.5 |
| Variation in ΔVp (%) | 25.08 | 11.13 | 0.00 | 8.93 | 16.35 |

SUMMARY OF THE INVENTION

In view of the above, an embodiment of the invention includes an array substrate of FFS type LCD in which variation in feed through voltage is decreased even in case of dimensional deviation occurring in pixel electrodes.

According to an embodiment of the invention, an array substrate of Fringe Field Switching type liquid crystal display is provided. The array substrate comprises a scanning line; a data line crossing the scanning line; a pixel electrode; a common electrode; and a Thin Film Transistor comprising a gate electrode connected to the scanning line, a source electrode connected to the data line and a drain electrode connected to the pixel electrode, the drain electrode and the scanning line forming a first capacitor therebetween. The array substrate according to an embodiment of the invention further comprises an auxiliary capacitor which is in parallel with the first capacitor.

The auxiliary electrode may comprise a first electrode and a second electrode. The first electrode may be formed in the same processing with the pixel electrode. A material of the first electrode may be same with that of the pixel electrode, and the material may be a transparent conductive material. The first electrode may comprise an opening or slot portion, and may overlap at least a part of the scanning line. The second electrode of the auxiliary capacitor may be formed either by the scanning line or by a conductor electrically connected to the scanning line.

Alternatively, the first electrode may be formed in the same processing with the common electrode. A material of the first electrode may be same with that of the common electrode. The material may be a transparent conductive material. The first electrode may preferably comprise an opening or slot portion, and may preferably overlap at least a part of the scanning line. The second electrode of the auxiliary capacitor may be formed either by the scanning line or by a conductor electrically connected to the scanning line.

According to an embodiment of the invention, the auxiliary capacitor is in parallel with the first capacitor. The first electrode of the auxiliary capacitor may be formed in the same manufacturing step or processing with the pixel electrode or the common electrode, and may use the same material. Therefore, variation in storage capacitor due to dimensional variation that occurs in the pixel electrode may be counteracted, resulting a decreased variation in feed through voltage, and degradation in display, such as flicker of the picture and the like, is prevented.

A method for manufacturing the above described array substrate of FFS type LCD is also provided in an embodiment.

BRIEF DESCRIPTION OF THE DRAWINGS

From the following detailed description to the embodiments, accompanying with the drawings, the present invention will be more apparent. In the drawings.

DETAILED DESCRIPTION OF EMBODIMENTS

Some illustrative embodiments of the invention will be described in the following with reference to the accompany drawings.

Figure 3:
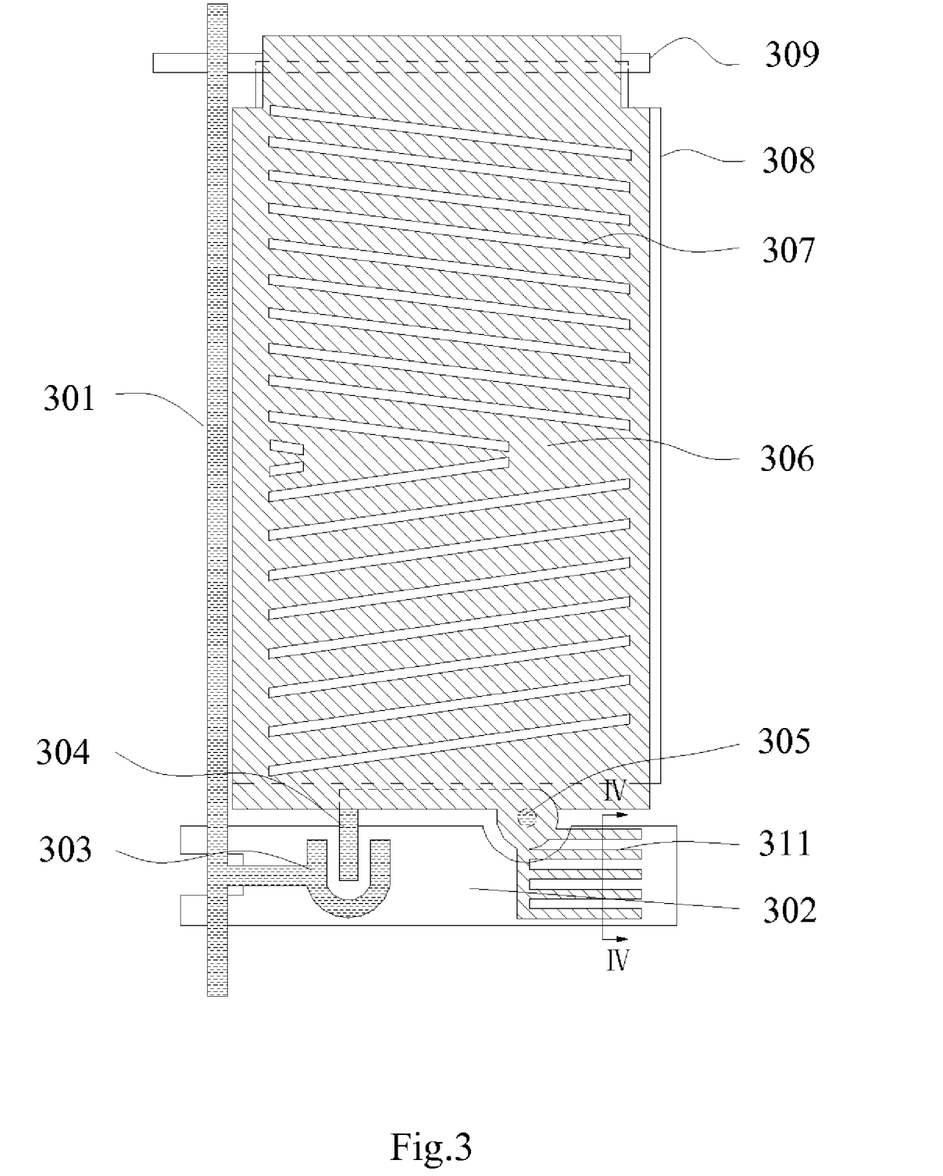
FIG. 3 is an illustrative plan view of a structure of pixel in an array substrate of FFS type LCD according to a first embodiment of the invention.

FIG. 3 is an illustrative plan view of a structure of pixel in an array substrate of FFS type LCD according to the first embodiment of the invention. On the array substrate, a data line 301 and a scanning line 302 cross with each other and form a pixel at the crossing area. Typically there are a plurality of data lines and a plurality of scanning lines arranged in a crossing manner and forming a plurality of pixels. For clarity, only one pixel is shown in FIG. 3. Similar to FIG. 1, only the array substrate portion in the liquid crystal display is shown in FIG. 3, while the liquid crystal layer and the color filter are omitted. The data line 301 is connected to a source electrode 303 of a TFT, the scanning line 302 is connected to a gate electrode of the TFT, and a pixel electrode 306 is connected to a drain electrode 304 of the TFT via a through-hole 305. The pixel electrode 306 is provided with stripe-like slits 307 each of which may have a width of 4 to 10 μm for example. Voltage is supplied to a common electrode 308 via a common electrode bus line 309. As used herein, "a scanning line connected to a gate electrode of the TFT" covers the situation in which a portion of the scanning line itself is used as the gate electrode of the TFT.

In addition to the above components, an auxiliary capacitor electrode 311 is provided in the embodiment. The auxiliary capacitor electrode 311 is connected to the pixel electrode 306 and overlaps at least a portion of the scanning line 302 to form an auxiliary capacitor 418 whose capacitance value is indicated with Cgs1. Preferably, the auxiliary capacitor electrode 311 has an opening or slot portion in its shape similar to the slit 307 in the pixel electrode 306. The auxiliary capacitor electrode 311 will be described later in more detail. In the present embodiment, the auxiliary capacitor electrode 311 serves as a first electrode of the auxiliary capacitor 418, and the scanning line 302 serves as a second electrode of the auxiliary capacitor 418. In other embodiments, a conductor electrically connected to the scanning line may serve as the second electrode of the auxiliary capacitor.

Figure 4:
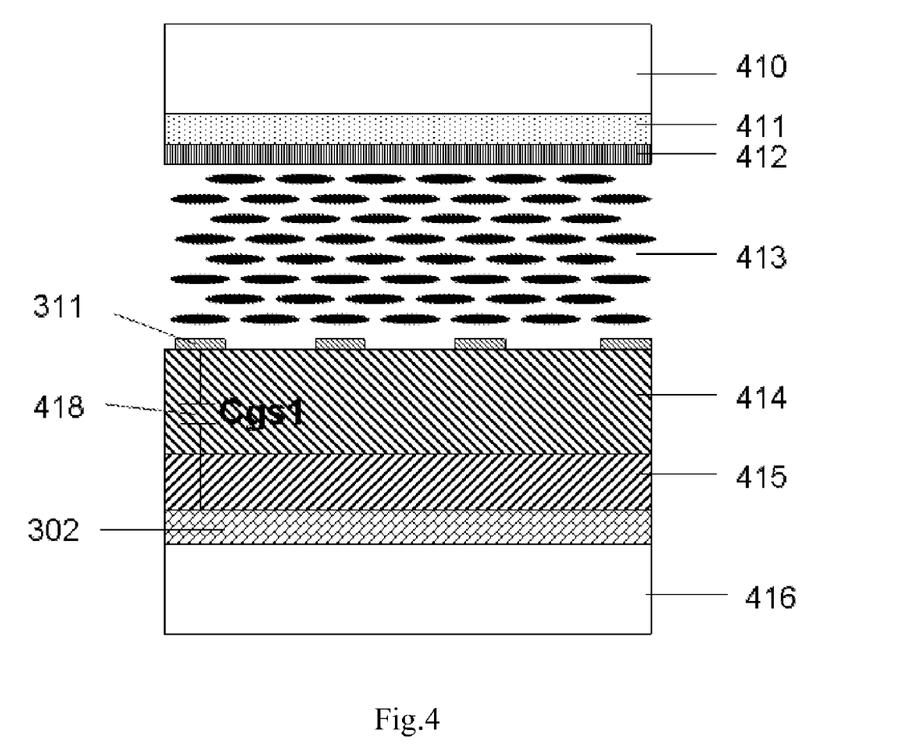
FIG. 4 is a sectional view that shows the auxiliary capacitor electrode overlying the scanning line according to the first embodiment of the invention.

FIG. 4 is a sectional view along a line IV-IV of FIG. 3 that shows the auxiliary capacitor electrode 311 overlying the scanning line 302 in the embodiment. In the structure shown in FIG. 4, an array substrate portion comprises, in an order from the bottom up, a glass substrate 416, the scanning line 302, a gate electrode insulating layer 415 and a passivation layer 414. A color filter portion comprises, in an order from the top down, a glass substrate 410 for a color filter, a color filter film 411 and a protection layer 412. A liquid crystal layer 413 is positioned between the array substrate portion and the color filter portion. The auxiliary capacitor 418 is formed in such a structure that the auxiliary capacitor electrode 311 serves as an upper capacitor electrode, the scanning line 302 serves as a lower capacitor electrode, and the gate electrode insulating layer 415 and the passivation layer 414 sandwiched between the capacitor electrodes serve as a dielectric. It is also possible to use any other suitable material known in the art for the substrates 416 in place of glass.

Figure 8:
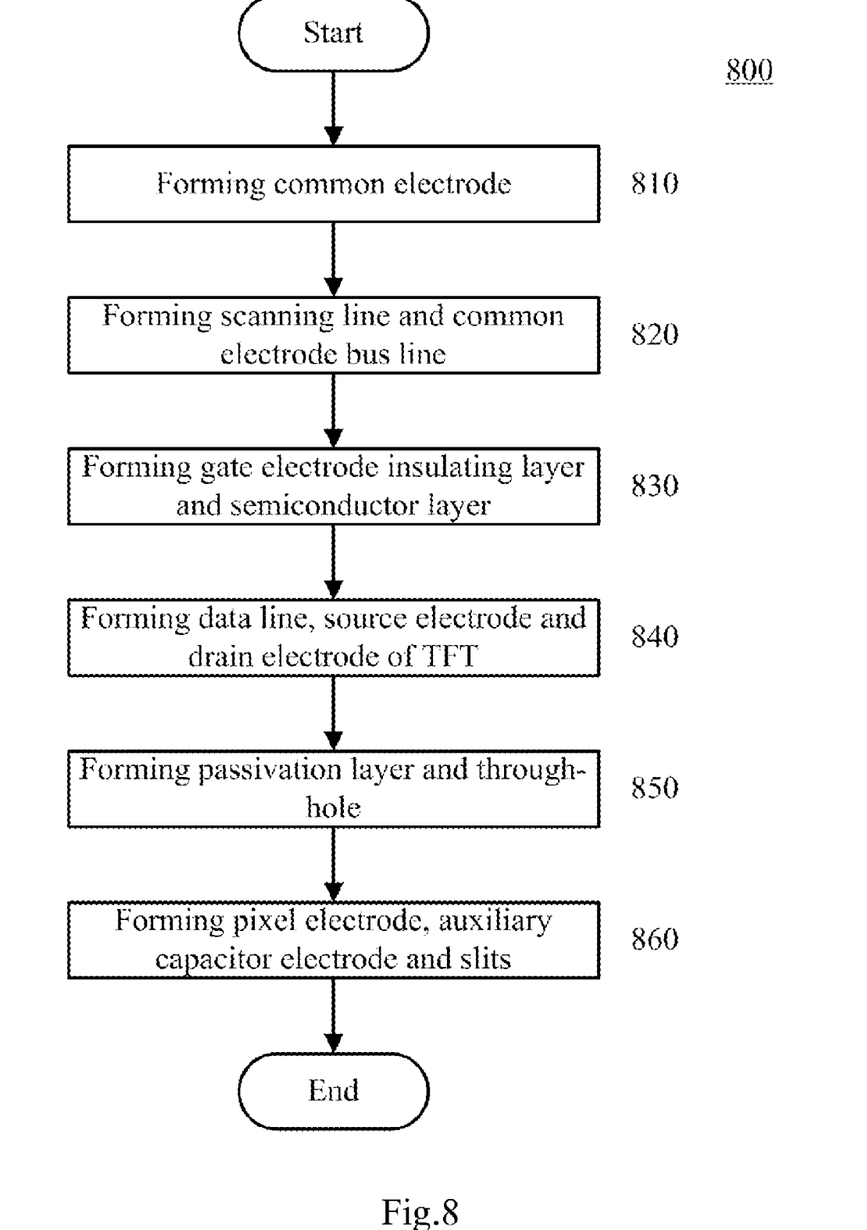
FIG. 8 shows an illustrative processing method for manufacturing the array substrate of FFS type LCD according to the first embodiment of the invention.

An array substrate having a structure of pixel described above can be formed using an illustrative processing method 800 shown in FIG. 8.

First, a common electrode 308 is formed (810) on a substrate 416 made of, for example, glass. The common electrode 308 is formed (810) with a transparent conductive material, which may be Indium-Tin Oxide (ITO), Indium-Zinc Oxide (IZO) and the like. For example, a layer of ITO having a thickness of about 1000 angstroms ($10^{-7}$ m) may be formed on a glass substrate by sputtering, and then etched into a desired shape to obtain the common electrode 308.

Then, a scanning line 302 and a common electrode bus line 309 are formed (820) on the substrate 416 obtained at the forming (810), with the common electrode bus line 309 electrically connected to the common electrode 308 formed (810) previously. A gate electrode of TFT may be provided by a portion of the scanning line 302, or may be separately formed and electrically connected to the scanning line. For example, the scanning line 302 and the common electrode bus line 309 may be formed by a double layer structure composed of a layer of Mo having a thickness of about 500 angstroms and a layer of AlNd having a thickness of about 3000 angstroms via sputtering on a suitable portion of the substrate 416.

Next, a gate electrode insulating layer 415 and a semiconductor layer that is not shown in the figures are formed (830) in order on the substrate obtained (820) above the common electrode 308, the common electrode bus line 309 and the scanning line 302. For example, at the forming (830), a layer of SiNe having a thickness of about 3000 angstroms formed with $SiH_4$ and $NH_3$, a layer of amorphous silicon hydride (a-Si:$H_x$) having a thickness of about 1300 angstroms formed with $SiH_4$ and $H_2$, and a layer of doped amorphous silicon hydride ($n^+$a-Si:$H_x$) having a thickness of about 250 angstroms formed with $SiH_4$, $H_2$ and $PH_3$, may be formed by a deposition processing, e.g., PECVD processing.

Next, a data line 301 is formed (840) as well as a source electrode 303 and a drain electrode 304 of TFT, and the source electrode 303 of TFT is electrically connected to the data line 301. For example, a triple layer structure composed of a layer of Mo having a thickness of about 450 angstroms, a layer of Al having a thickness of about 2000 angstroms and a layer of Mo having a thickness of about 150 angstroms may be formed (840) via sputtering.

Next, a passivation layer 414 is formed (850) above the layers formed previously (810-840), and a through-hole 305 is formed (850) in the passivation layer 414. For example, the passivation layer 414 may be formed by a layer of $SiN_x$ having a thickness of about 4500 angstroms with $SiH_4$ and $NH_3$ via PECVD.

Next, a pixel electrode 306 and an auxiliary capacitor electrode 311 are formed (860) above the passivation layer 414. For example, the pixel electrode 306 and the auxiliary capacitor electrode 311 may be formed with a layer of ITO having a thickness of about 750 angstroms by sputtering. Also, slits 307 are formed (860) in the pixel electrode 306 and an opening or slot portion is formed in the auxiliary capacitor electrode 311 by etching for example, and the pixel electrode 306 is connected to the drain electrode 304 of TFT via the through-hole 305.

With the method described above, an array substrate having a structure shown in FIGS. 3 and 4 is obtained, which may then be adhered to a color filter portion with liquid crystal material sandwiched in between.

It is noted that the processing parameters such as materials and thicknesses describe above are illustrative only and do not intend to be a limitation of the invention. Other processing parameters may also be used as appropriate. Furthermore, parts of the method may be combined, one or more of the parts may be omitted, and auxiliary parts may be incorporated therein if necessary.

In the array substrate obtained with the above method 800, the capacitance value Cgson between the scanning line 302 and the drain electrode 304 of TFT is composed of Cgson', which is the capacitance value of a first capacitor between the scanning line 302 and the drain electrode 304 and similar to the first capacitor between the scanning line 102 and the drain electrode 104 in the prior art, and Cgs1, which is the capacitance value of the auxiliary capacitor 418. Of the auxiliary capacitor 418, one electrode plate (that is, the auxiliary capacitor electrode 311) is connected to the pixel electrode 306 and further connected to the drain electrode 304 of TFT via the through-hole 305, and the other electrode plate is provided by the scanning line 302. Therefore, the auxiliary capacitor 418 is in parallel with the first capacitor, and the following equation (3) is established.

$$Cgson/Cst=(Cgson'+Cgs1)/Cst \qquad (3)$$

The auxiliary capacitor electrode 311 serves as the upper capacitor electrode of the auxiliary capacitor 418 as described above, and is formed in the same manufacturing step or processing with the pixel electrode 306. In an embodiment, the electrode 311 may be formed with the same material as the pixel electrode 306, for example, ITO, IZO and the like. In an embodiment, the auxiliary capacitor electrode 311 may be provided with an opening or slot portion therein, similar to the pixel electrode 306 with the stripe-like slits 307. As such, when dimensional deviations occur in the pixel electrode 306 having the slits 307 during processing, corresponding deviations will also occur in the auxiliary capacitor electrode 311, for example, shift in the same direction as that in the pixel electrode 306, expansion or shrink in accordance with that in the pixel electrode 306, and so on. Therefore, when the capacitance value Cst of the storage capacitor varies due to dimensional deviations in the pixel structure, the capacitance value Cgs1 of the auxiliary capacitor 418 varies correspondingly due to dimensional deviations that occur in the auxiliary capacitor electrode 311. From the equation (3), the capacitance values Cgs1 of the auxiliary capacitor 418 and Cst of the storage capacitor are in the numerator and the denominator portions of the ratio Cgson/Cst, respectively. That is, the ratio will increase (or decrease) when Cgs1 increases (or decreases), and will decrease (or increase) when Cst increases (or decreases). Therefore, the values of Cgs1 and Cst vary simultaneously and correspondingly (both increase or both decrease), and cause opposite variations of the ratio which can be canceled out at least partially. Thus the variation in the capacitance value Cst of the storage capacitor due to the dimensional deviations in the pixel electrode 306 is balanced.

From the equation (3), in comparison with the case that the auxiliary capacitor 418 is absent, the ratio Cgson/Cst becomes larger. However, the level of variation in the ratio becomes smaller when the auxiliary capacitor 418 exists, because Cgson increases or decreases in company with Cst. That is, the value of the feed through voltage ΔVp increases, while the degree of variation thereof decreases. Table 2 shows the simulation data of variation in feed through voltage ΔVp for a 32-inch LCD to which an array substrate having the structure according to the first embodiment is applied.

TABLE 2 variation in feed through voltage for a 32" LCD applying the first embodiment

| | Dimensional deviation in pixel electrode (μm) | | | | |
|---|---|---|---|---|---|
| | −0.5 | −0.25 | 0 | 0.25 | 0.5 |
| Cgson/Cst | 0.06321 | 0.06054 | 0.05844 | 0.05686 | 0.05560 |
| ΔVp (V) | 1.83 | 1.76 | 1.69 | 1.65 | 1.61 |
| Variation in ΔVp (%) | 8.16 | 3.59 | 0.00 | 2.70 | 4.86 |

Table 2 shows that the variations in ΔVp in the structure according to an embodiment of the invention are much less than those shown in Table 1. Thus LCDs can display pictures with greatly improved quality, and flicker of pictures and the like are prevented. In addition, the auxiliary capacitor electrode 311 and the pixel electrode 306 can be formed in the same processing, therefore no processing steps are introduced, and the cost is not substantially increased.

Figure 5:
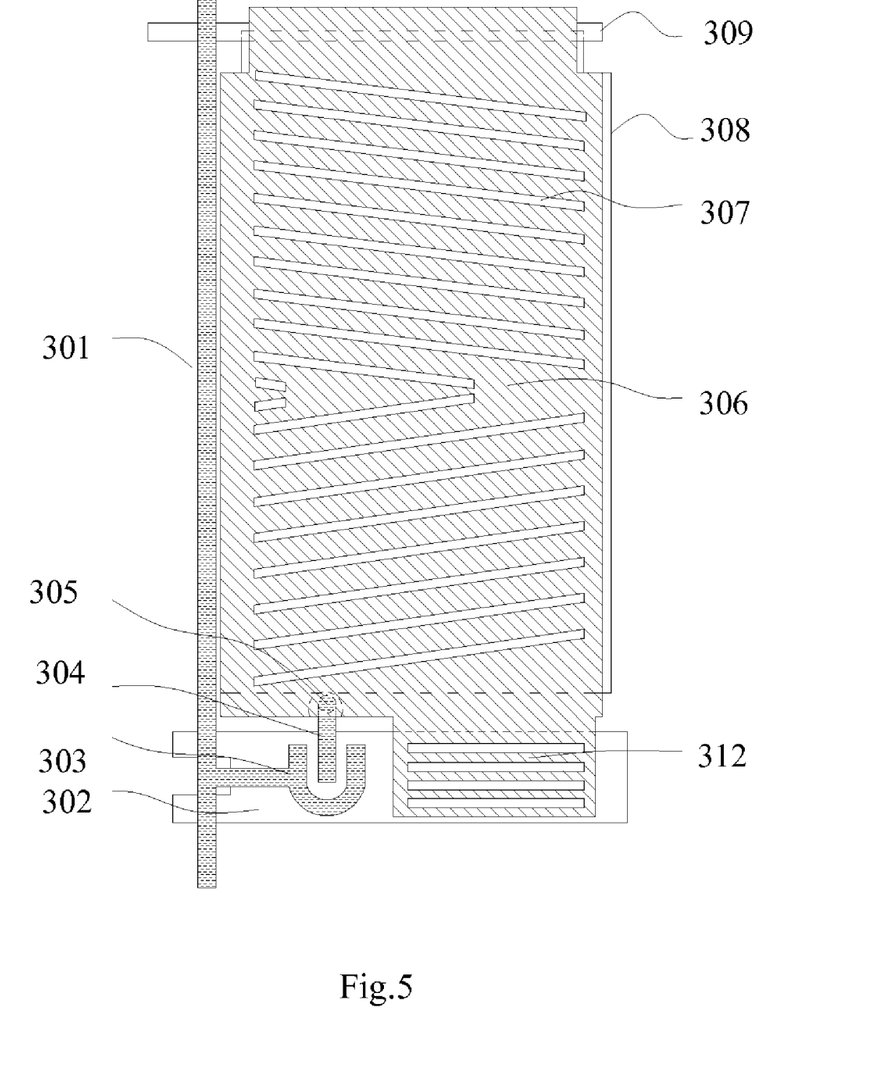
FIG. 5 is an illustrative plan view of a structure of pixel in an array substrate of FFS type LCD according to a second embodiment of the invention.

FIG. 5 shows the second embodiment of the invention in which an auxiliary capacitor electrode 312 has a grid-like shape and can be obtained by extending the pixel electrode 306 directly. That is, the pixel electrode 306 may be designed such that the grid-like portion is included in its shape instead of designed separately. Also, at the forming (860) above, only a pixel electrode 306 including the grid-like shape is manufactured, and no auxiliary capacitor electrode is additionally manufactured. Other portions in the second embodiment, for example, the data line, the scanning line, the pixel electrode and the like, are substantially similar with those in the first embodiment in terms of structure and processing, and will not be described in detail.

Figure 6:
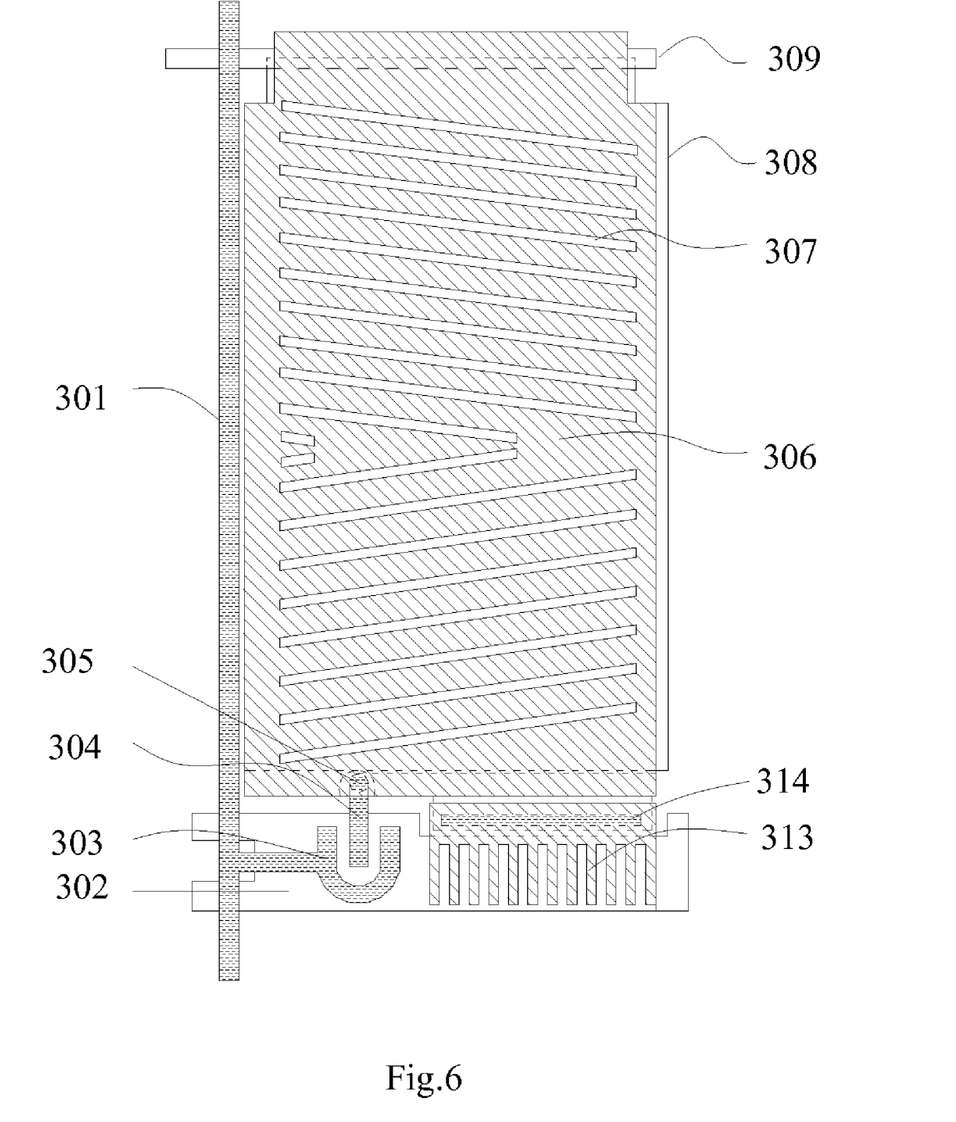
FIG. 6 is an illustrative plan view of a structure of pixel in an array substrate of FFS type LCD according to a third embodiment of the invention.

FIG. 6 shows the third embodiment of the invention, in which the auxiliary capacitor electrode 313 has a comb-like shape, and is connected to the drain electrode 304 of TFT via a through-hole 314 in the passivation layer instead of extending from the pixel electrode 306. The through-hole 314 in the third embodiment may be accomplished in the same processing with the through-hole 305, and hence no additional step is required. Other portions such as the data line, the scanning line, the pixel electrode and the like are substantially similar with those in the first embodiment in terms of structure and processing, and will not be described in detail.

Figure 7:
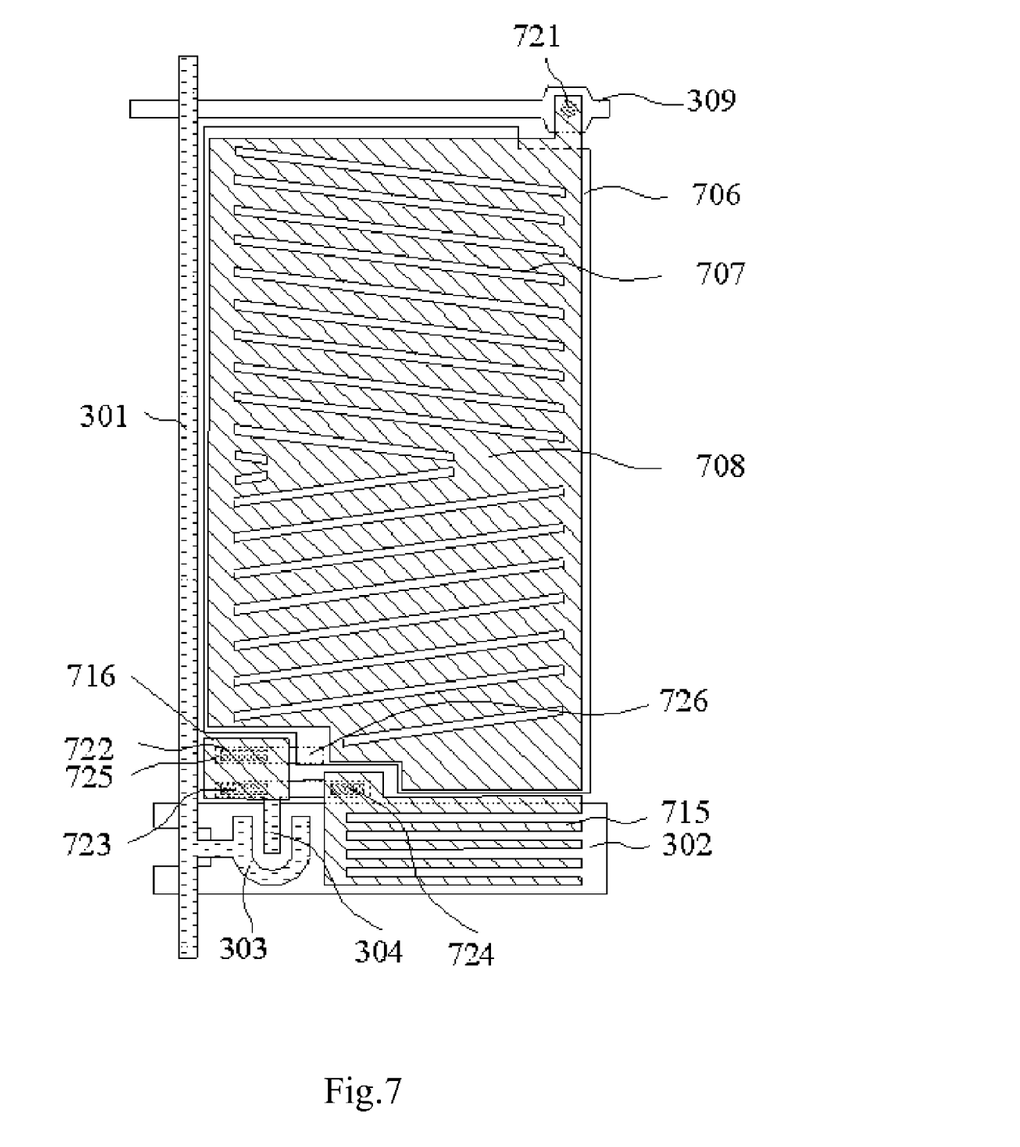
FIG. 7 is an illustrative plan view of a structure of pixel in an array substrate of FFS type LCD according to a fourth embodiment of the invention.

FIG. 7 shows the fourth embodiment of the invention, in which a pixel electrode 706 underlies a transparent common electrode 708 on which slits 707 are formed, and a common electrode 708 is connected to a common electrode bus line 309 via a through-hole 721.

In the fourth embodiment, the pixel electrode 706 lies in a layer under the common electrode 708 and partially overlaps a first connecting electrode 725 in a region 726. The pixel electrode 706 is connected to the first connecting electrode 725 via the overlapping region 726. The first connecting electrode 725 is in turn connected to a second connecting electrode 716 via a through-hole 722 in the gate electrode insulating layer and the passivation layer, and the drain electrode 304 of TFT is connected to the second connecting electrode 716 via a through-hole 723 in the passivation layer. Here, the second connecting 716 is formed with the same material as the common electrode 708, for example, a transparent conductive material such as ITO, IZO and the like. As a result, the connection between the pixel electrode 706 and the drain electrode 304 of TFT is achieved via the first connecting electrode 725, the through-hole 722, the second connecting electrode 716 and the through-hole 723.

The auxiliary capacitor electrode 715 overlaps the scanning line 302 at least partially, and is connected to the drain electrode 304 of TFT via a through-hole 724 in the passivation layer. In an embodiment, the auxiliary capacitor electrode 715 may be formed in the same processing with the common electrode 708, and may comprise the same material with the common electrode 708, for example, a transparent conductive material such as ITO, IZO and the like.

Figure 9:
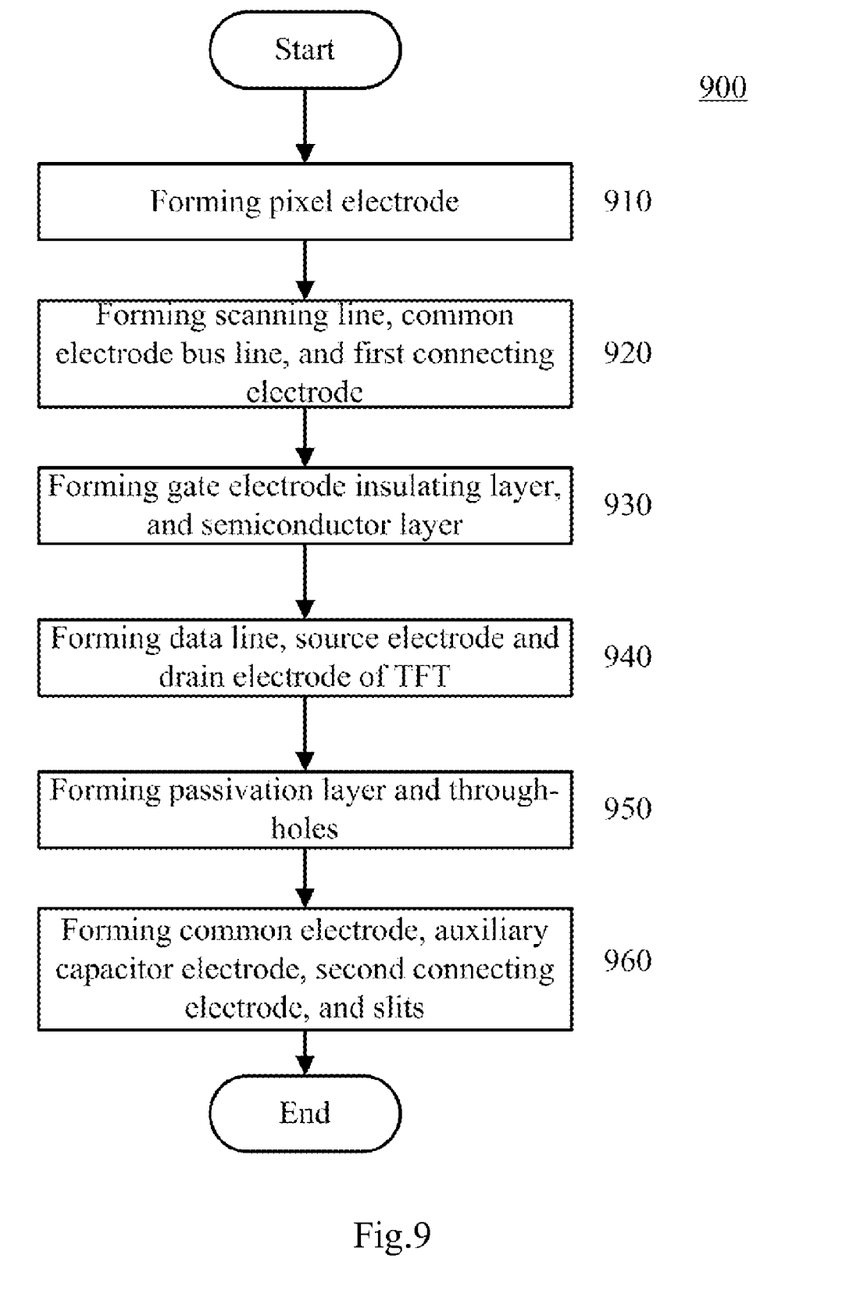
FIG. 9 shows an illustrative processing method for manufacturing the array substrate of FFS type LCD according to the fourth embodiment of the invention.

An array substrate having the structure of the fourth embodiment can be formed with an illustrative processing method 900 shown in FIG. 9.

First, a pixel electrode 706 is formed (910) on a substrate 416 made of, for example, glass. The pixel electrode 706 is formed with a transparent conductive material such as Indium-Tin Oxide (ITO), Indium-Zinc Oxide (IZO) and the like. For example, a layer of ITO having a thickness of about 1000 angstroms ($10^{-7}$ m) may be formed on a glass substrate by sputtering, and then etched into a desired shape to obtain the pixel electrode 706.

Next, a scanning line 302, a common electrode bus line 309 and a first connecting electrode 725 are formed (920) on the substrate 416 obtained at the forming (910). The first connecting electrode 725 partially overlaps the pixel electrode 706, and is connected to the pixel electrode 706 via the overlapping region 726. A gate electrode of TFT may be provided by a portion of the scanning line 302, or may be separately formed and electrically connected to the scanning line. For example, the scanning line 302, the common electrode bus line 309 and the first connecting electrode may be formed by a double layer structure composed of a layer of Mo having a thickness of about 500 angstroms and a layer of AlNd having a thickness of about 3000 angstroms via sputtering on a suitable portion of the substrate 416.

Next, a gate electrode insulating layer and a semiconductor layer that is not shown in the figures are formed (930) in order on the substrate obtained at the forming (920) above the pixel electrode 706, the common electrode bus line 309 and the scanning line 302. For example, a layer of $SiN^x$ having a thickness of about 3000 angstroms formed with $SiH_4$ and $NH_3$, a layer of amorphous silicon hydride (a-Si:$H_x$) having a thickness of about 1300 angstroms formed with $SiH_4$ and $H_2$, and a layer of doped amorphous silicon hydride ($n^+$a-Si:$H_x$) having a thickness of about 250 angstroms formed with $SiH_4$, $H_2$ and $PH_3$, may be formed by a deposition processing, preferably PECVD processing.

Next, a data line 301 is formed (940) as well as a source electrode 303 and a drain electrode 304 of TFT, and the source electrode 303 of TFT is electrically connected to the data line 301. For example, a triple layer structure composed of a layer of Mo having a thickness of about 450 angstroms, a layer of Al having a thickness of about 2000 angstroms and a layer of Mo having a thickness of about 150 angstroms may be formed via sputtering.

Next, a passivation layer is formed (950) above the layers formed in the previous formings (910-940), and through-holes 721, 722, 723 and 724 are formed (950) in the passivation layer. For example, the passivation layer may be formed by a layer of $SiN_x$ having a thickness of about 4500 angstroms with $SiH_4$ and $NH_3$ via PECVD.

Next, a common electrode 708, an auxiliary capacitor electrode 715 and a second connecting electrode 716 are formed (960) above the passivation layer 414. For example, the common electrode 708, the auxiliary capacitor electrode 715 and the second connecting electrode 716 may be formed with a layer of ITO having a thickness of about 750 angstroms by sputtering. Slits 307 are also formed (960) in the common electrode 708 and an opening or slot portion is formed in the auxiliary capacitor electrode 715 by etching for example. Additionally, the common electrode 708 is connected (960) to the common electrode bus line 309 via the through-hole 721 in the passivation layer, the second connecting electrode 716 is connected to the first connecting electrode 725 via the through-hole 722 in the passivation layer, the second connecting electrode 716 is connected to the drain electrode 304 of TFT via the through-hole 723 in the passivation layer, and the drain electrode 304 of TFT is connected to the auxiliary capacitor electrode 715 via the through-hole 724 in the passivation layer.

Similar to the above description for the first embodiment, in the structure of the fourth embodiment, because of the auxiliary capacitor formed by the auxiliary capacitor electrode 715 and the scanning line 302, the variation in storage capacitor due to dimensional variation that occurs when forming slits 707 in the common electrode 708 is substantially balanced, resulting in an improved quality of display, and flicker of the pictures and the like are prevented. In addition, the auxiliary capacitor electrode 715 can be formed in the same processing or forming (960) with the common electrode 708, therefore no additional processing steps are required and the cost is not substantially increased.

It is noted that the shape of the auxiliary capacitor electrode is not limited to the specific shapes in the above embodiments. Any shapes, which work to counteract variation in the capacitance value Cst due to dimensional variation in the pixel electrode, are within the scope of the invention. These shapes include, but not limit to, a zigzag shape ("W" shape), a comb-like shape ("E" shape), a grid-like shape, a branched shape ("Y" shape), a ring-like shape, and so on. Although the auxiliary capacitor electrode overlaps the scanning line, such a positioning relation is not necessary. For example, the auxiliary capacitor electrode may also form an auxiliary capacitor with the scanning line in case that the electrode overlaps any conductor electrically connected to the scanning line. Therefore, the invention works so long as the first capacitor formed between the drain electrode of TFT and the scanning line is in parallel with the auxiliary capacitor. Also, the manner in which the auxiliary capacitor electrode and the drain electrode of TFT is connected and the processing steps that may be employed are not limited to those described in the specific embodiments. Various modifications and alternatives to the above embodiments within the scope of the invention are apparent for those skilled in the art. Therefore, the present invention is defined only by the appended claims and the equivalents thereof.

What is claimed is:

1. A fringe field switching type liquid crystal display array substrate, comprising:
    a scanning line;
    a data line crossing the scanning line;
    a pixel electrode;
    a common electrode, the common electrode and the pixel electrode forming a storage capacitor;
    a thin film transistor comprising a gate electrode connected to the scanning line, a source electrode connected to the data line and a drain electrode connected to the pixel electrode, the drain electrode and the scanning line forming a first capacitor therebetween;
    wherein the array substrate further comprises an auxiliary capacitor in parallel with the first capacitor and adapted for counteracting a variation in the storage capacitor and further for decreasing a variation in feed through voltage, the auxiliary capacitor comprises a first electrode and a second electrode, the first electrode being formed in the same processing with the pixel electrode, the pixel electrode is provided with stripe-like slits, and the first electrode comprises an opening or slot portion with the stripe-like slits.

2. The fringe field switching type liquid crystal display array substrate according to claim 1, wherein a material of the first electrode is the same as a material of the pixel electrode.

3. The fringe field switching type liquid crystal display array substrate according to claim 2, wherein the material of the pixel electrode is a transparent conductive material.

4. The fringe field switching type liquid crystal display array substrate according to claim 1, wherein the second electrode of the auxiliary capacitor is formed by the scanning line.

5. The fringe field switching type liquid crystal display array substrate according to claim 4, wherein the first electrode overlaps at least a part of the scanning line.

6. The fringe field switching type liquid crystal display array substrate according to claim 1, wherein the second electrode of the auxiliary capacitor is formed by a conductor electrically connected to the scanning line.

7. The fringe field switching type liquid crystal display array substrate according to claim 1, wherein the first electrode is a portion extending from the pixel electrode.

8. The fringe field switching type liquid crystal display array substrate according to claim 1, wherein one end of the first electrode is connected to the drain electrode of the thin film transistor.

9. A method for manufacturing the fringe field switching type liquid crystal display array substrate according to claim 1 comprising:
    a) forming a common electrode on a substrate;
    b) forming a scanning line and a common electrode bus line on the substrate the common electrode bus line being electrically connected with the common electrode;
    c) forming a gate electrode insulating layer and a semiconductor layer in order above the common electrode, the common electrode bus line and the scanning line on the substrate;
    d) forming a data line, a source electrode and a drain electrode of Thin Film Transistor on the substrate, the source electrode being electrically connected with the data line;

e) forming a passivation layer on the substrate, and forming a through-hole in the passivation layer; and f) forming a pixel electrode and an auxiliary capacitor electrode over the passivation layer, and forming slits in the pixel electrode.

10. The method according to claim 9, wherein the auxiliary capacitor electrode forms an auxiliary capacitor with at least a part of the scanning line, the auxiliary capacitor being in parallel with a first capacitor formed between the drain electrode and the scanning line.

11. The method according to claim 9, wherein a material of the auxiliary capacitor electrode is same with that of the pixel electrode.

12. The method according to claim 9, wherein the auxiliary capacitor electrode comprises an opening or slot portion.

13. The method according to claim 9, wherein the auxiliary capacitor electrode overlaps at least a part of the scanning line.

* * * * *